(12) United States Patent
Cheng

(10) Patent No.: US 10,600,351 B2
(45) Date of Patent: Mar. 24, 2020

(54) SEMICONDUCTOR DEVICE HAVING A MULTI-TERMINAL TRANSISTOR LAYOUT

(71) Applicant: INT TECH CO., LTD., Hsinchu County (TW)

(72) Inventor: Shih-Song Cheng, Kaohsiung (TW)

(73) Assignee: INT TECH CO., LTD., Zhubei, Hsinchu County (TW)

( * ) Notice: Subject to any disclaimer, the term of this patent is extended or adjusted under 35 U.S.C. 154(b) by 0 days.

(21) Appl. No.: 15/680,751

(22) Filed: Aug. 18, 2017

(65) Prior Publication Data

US 2018/0138276 A1 May 17, 2018

Related U.S. Application Data

(60) Provisional application No. 62/421,435, filed on Nov. 14, 2016.

(51) Int. Cl.
| | |
|---|---|
| *H01L 29/786* | (2006.01) |
| *G09G 3/20* | (2006.01) |
| *G06F 3/14* | (2006.01) |
| *H01L 23/528* | (2006.01) |
| *H01L 27/32* | (2006.01) |

(Continued)

(52) U.S. Cl.
CPC ......... *G09G 3/2092* (2013.01); *G06F 3/1446* (2013.01); *G09G 3/30* (2013.01); *H01L 23/528* (2013.01); *H01L 27/3211* (2013.01); *H01L 27/3248* (2013.01); *H01L 29/41733* (2013.01); *H01L 29/78* (2013.01); *H01L 51/5036* (2013.01); *G09G 3/3208* (2013.01); *G09G 3/3611* (2013.01); *G09G 2300/026* (2013.01); *G09G 2300/0439* (2013.01); *G09G 2300/0819* (2013.01); *G09G 2310/0278* (2013.01); *G09G 2320/0204* (2013.01); *G09G 2320/029* (2013.01); *G09G 2320/0233* (2013.01);

(Continued)

(58) Field of Classification Search
CPC ............. H01L 27/088; H01L 29/78645; H01L 29/42312; H01L 29/42316; H01L 29/4232; H01L 29/0843
See application file for complete search history.

(56) References Cited

U.S. PATENT DOCUMENTS

| | | | |
|---|---|---|---|
| 5,929,947 A | 7/1999 | Tani et al. | |
| 5,965,925 A * | 10/1999 | Kornachuk | G11C 7/065 257/401 |

(Continued)

FOREIGN PATENT DOCUMENTS

| | | |
|---|---|---|
| TW | 473640 B | 1/2002 |
| TW | 200408132 A | 5/2004 |
| TW | 200537218 A | 11/2005 |

OTHER PUBLICATIONS

First Office Action in corresponding Taiwan application 106131487, dated Sep. 28, 2018, 6 pages in Chinese, 2 pages in English.

*Primary Examiner* — Jae Lee
(74) *Attorney, Agent, or Firm* — Juan Carlos A. Marquez; Marquez IP Law Office, PLLC

(57) ABSTRACT

A semiconductor device includes a gate region, a source/drain region and an insulating layer between the gate region and the source/drain region. The source/drain region includes a first leg extending in a first direction, a second leg extending in parallel with the first leg, and a third leg connected between the first leg and the second leg.

20 Claims, 12 Drawing Sheets

(51) Int. Cl.
*H01L 29/78* (2006.01)
*H01L 51/50* (2006.01)
*G09G 3/30* (2006.01)
*H01L 29/417* (2006.01)
*G09G 3/36* (2006.01)
*G09G 3/3208* (2016.01)

(52) U.S. Cl.
CPC ... *G09G 2320/045* (2013.01); *G09G 2330/02* (2013.01); *H01L 27/3244* (2013.01)

(56) References Cited

U.S. PATENT DOCUMENTS

| | | | |
|---|---|---|---|
| 6,601,224 B1 * | 7/2003 | Kiss | G06F 17/5068 257/202 |
| 8,058,694 B2 * | 11/2011 | Shimomura | H01L 29/78 257/153 |
| 2003/0089910 A1 * | 5/2003 | Inukai | H01L 27/1214 257/66 |
| 2005/0173707 A1 | 8/2005 | Shiraki et al. | |
| 2010/0171569 A1 * | 7/2010 | Ionescu | H03H 3/0073 333/185 |

* cited by examiner

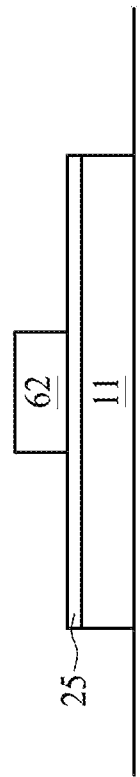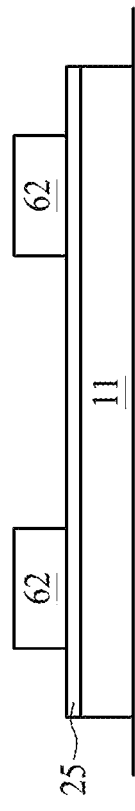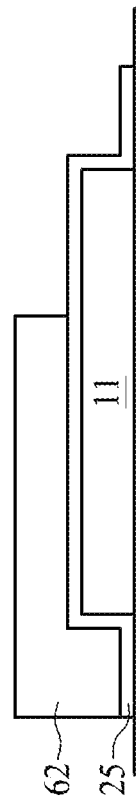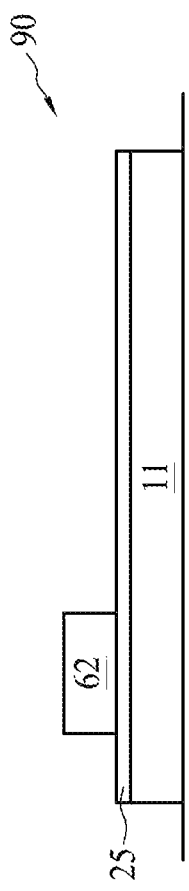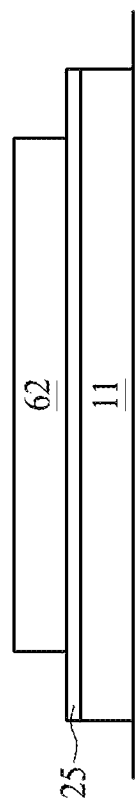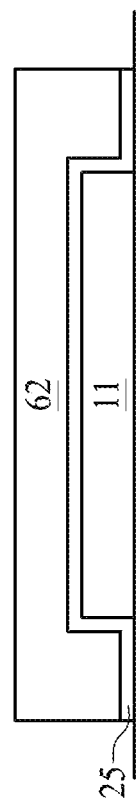

SEMICONDUCTOR DEVICE HAVING A MULTI-TERMINAL TRANSISTOR LAYOUT

CROSS REFERENCE TO RELATED APPLICATIONS

This application claims priority to U.S. provisional application Ser. No. 62/421,435, filed Nov. 14, 2016, the disclosure of which is hereby incorporated herein by reference.

BACKGROUND

Most transistors in their simplistic form are constructed using three main components, namely an insulating layer, a semiconductor layer, and electrodes including source, drain and gate electrodes. A source contact and a drain contact are directly in contact with the semiconductor layer, while the gate contact is separated from the semiconductor layer by the insulating layer. The transistors can be fabricated using a number of different structural layouts.

SUMMARY

Embodiments of the present invention provide a semiconductor device. The semiconductor device includes a gate region, a source/drain region and an insulating layer between the gate region and the source/drain region. The source/drain region includes a first leg extending in a first direction, a second leg extending in parallel with the first leg, and a third leg connected between the first leg and the second leg.

In an embodiment, the third leg extends in a second direction different from the first direction. For example, the second direction is orthogonal to the first direction.

In another embodiment, the source/drain region includes a first source/drain terminal, a second source/drain terminal and a third source/drain terminal. These terminals are not overlapped with the gate region.

In yet another embodiment, the first source/drain terminal and the gate region define a first transistor, the second source/drain terminal and the gate region define a second transistor, and the third source/drain terminal and the gate region define a third transistor.

In still another embodiment, one end of the third leg is connected to one end of the second leg.

In yet still another embodiment, the semiconductor device further includes a fourth source/drain terminal. Moreover, the fourth source/drain terminal and the gate region define a fourth transistor.

In an embodiment, the third leg is disposed proximate to source/drain terminals on the first leg and the second leg that define a charging current path together with the third leg.

In another embodiment, the third leg has a shape of a hump.

Some embodiments of the present invention also provide a semiconductor device. The semiconductor device includes a gate region and a source/drain region. The source/drain region further includes a first source/drain terminal, a second source/drain terminal, and a third source/drain terminal. The first, second and third source/drain terminals are separate from each other and each of the first, second and third source/drain terminals is not overlapped with the gate region.

In an embodiment, the first source/drain terminal and the gate region define a first transistor, the second source/drain terminal and the gate region define a second transistor, and the third source/drain terminal and the gate region define a third transistor.

In another embodiment, the source/drain region includes a first leg extending in a first direction from the first source/drain terminal to the second source/drain terminal.

In yet another embodiment, the source/drain region includes a second leg extending in parallel with the first leg, and a third leg connected between the first leg and the second leg.

In still another embodiment, one end of the third leg is connected to one end of the second leg.

In yet still another embodiment, the semiconductor device further includes a fourth source/drain terminal not overlapped with the gate region. Moreover, the fourth source/drain terminal and the gate region define a fourth transistor. Furthermore, the second leg extends from the third source/drain terminal to the fourth source/drain terminal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A to 10F are cross-sectional diagrams of the semiconductor device illustrated in FIG. 9, taken from lines AA to FF, respectively.

DETAILED DESCRIPTION

Figures 1A, 1B:
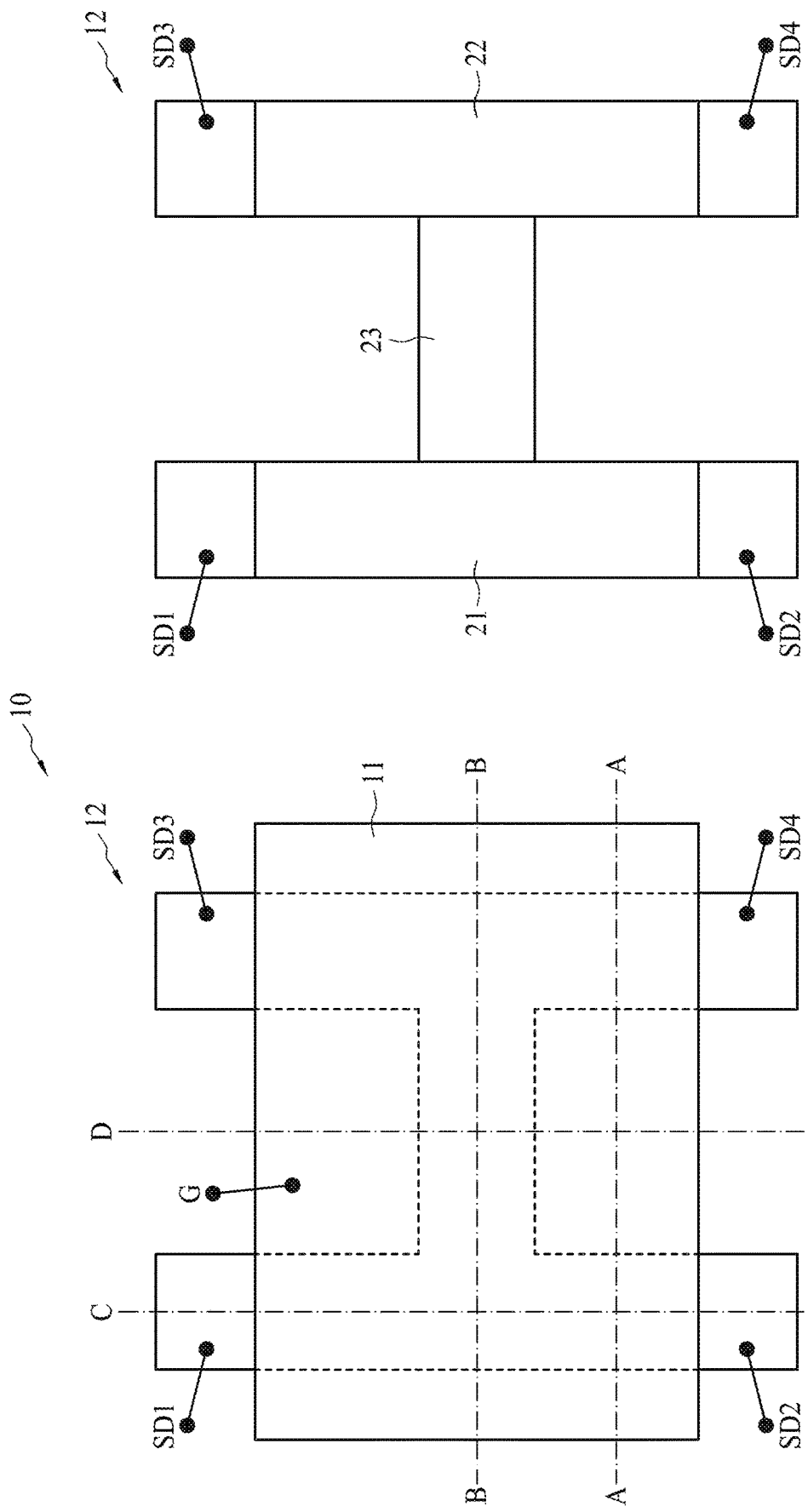
FIG. 1A is a schematic layout diagram of a semiconductor device, in accordance with some embodiments.
FIG. 1B is a schematic diagram of a source and drain region of the semiconductor device illustrated in FIG. 1A, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

FIG. 1A is a schematic layout diagram of a semiconductor device 10, in accordance with some embodiments.

Referring to FIG. 1A, the semiconductor device 10 includes a first region 11 and a second region 12. The first region 11, disposed over the second region 12, serves as a gate region for transistors defined in the semiconductor device 10. The second region 12, disposed on or over a substrate (not shown), serves as a source/drain region for the transistors. The transistors will be discussed in detail with reference to FIGS. 3A and 3B.

The first region 11 includes a gate terminal G for electrically connecting the transistors in the semiconductor device 10 to a bias source or other devices through an interconnection structure (not shown) that may further include conductive vias and metal layers. Also, the second region 12 includes source/drain terminals SD1 to SD4, which are not overlapped with the gate region 11, for the transistors. The source/drain terminals SD1 to SD4 may each function as a source terminal or a drain terminal, depending on the type of an associated transistor and a voltage level applied to the source/drain terminal.

FIG. 1B is a schematic diagram of the source/drain region 12 of the semiconductor device 10 illustrated in FIG. 1A, in accordance with some embodiments.

Referring to FIG. 1B, the source/drain region 12 includes a first leg 21, a second leg 22 and a third leg 23. The first leg 21 extends substantially in a first direction between a first source/drain terminal SD1 and a second source/drain terminal SD2. The second leg 22, separate from the first leg 21, extends substantially in parallel with the first leg 21 between a third source/drain terminal SD3 and a fourth source/drain terminal SD4. The third leg 23, extending in a second direction different from the first direction, is connected between the first leg 21 and the second leg 22. In the present embodiment, the second direction is substantially orthogonal to the first direction.

FIGS. 2A, 2B, 2C and 2D are cross-sectional diagrams of the semiconductor device 10 illustrated in FIG. 1A, taken from lines AA, BB, CC and DD, respectively.

Figure 2A:
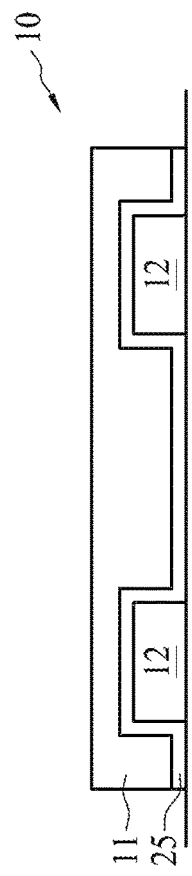
FIGS. 2A to 2D are cross-sectional diagrams of the semiconductor device illustrated in FIG. 1A, taken from lines AA to DD, respectively.
Figure 2B:
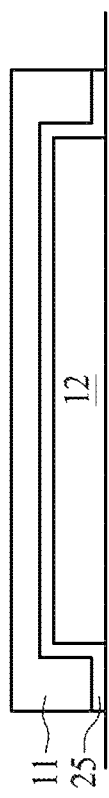
Figure 2C:
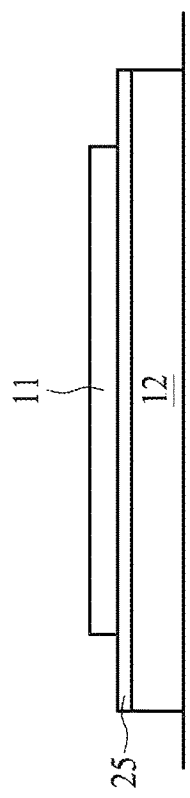
Figure 2D:
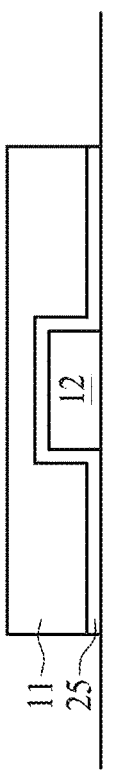

Referring to FIG. 2A, for example, the semiconductor device 10 includes an insulating layer 25, which is not shown in FIG. 1A for brevity. The insulating layer 25 is disposed between the gate region 11 and the source/drain region 12. In addition, since the gate region 11 is disposed over the source/drain region 12, the semiconductor device 10 is said to haves a "top-gate" structure and the transistors in the semiconductor device 10 are termed "top-gate transistors." In a top-gate structure, the source/drain region 12 is disposed between the gate region 11 and the substrate of the semiconductor device 10.

Figure 3B:
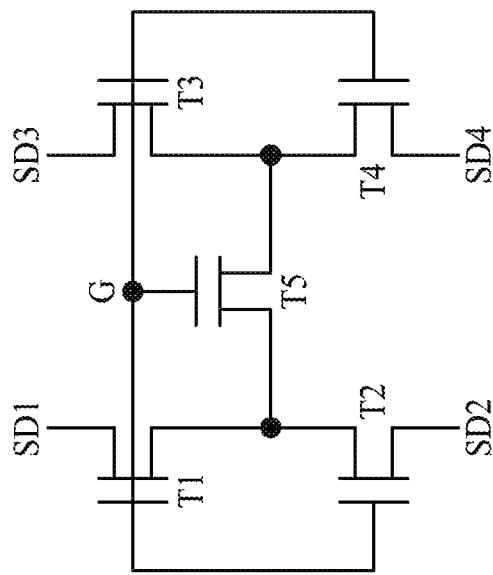
FIG. 3B is a circuit diagram of n-type transistors in the semiconductor device illustrated in FIG. 1A, in accordance with some embodiments.
Figure 3A:
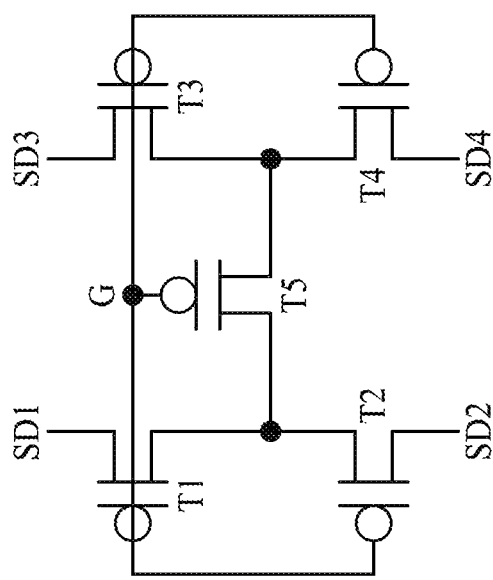
FIG. 3A is a circuit diagram of p-type transistors in the semiconductor device illustrated in FIG. 1A, in accordance with some embodiments.

FIG. 3A is a circuit diagram of p-type transistors T1 to T5 in the semiconductor device 10 illustrated in FIG. 1A, in accordance with some embodiments.

Referring to FIG. 3A and also to FIG. 1B, a first transistor T1 is defined by the first source/drain SD1 of the first leg 21, the third leg 23 and the gate region 11. In addition, a second transistor T2 is defined by the second source/drain SD2 of the first leg 21, the third leg 23 and the gate region 11. Also, a third transistor T3 is defined by the third source/drain SD3 of the second leg 22, the third leg 23 and the gate region 11. Moreover, a fourth transistor T4 is defined by the fourth source/drain SD4 of the second leg 22, the third leg 23 and the gate region 11. Furthermore, a fifth transistor T5 is defined by the third leg 23 and the gate region 11. The gate terminal G is common to the transistors T1 to T5.

Each of the transistors T1 to T5 may include a thin film transistor (TFT) or a metal-oxide-semiconductor (MOS) transistor. In the case of a TFT, the semiconductor device 10 includes a semiconductor layer that may be coplanar or staggered with the source/drain region 12. For brevity, such semiconductor layer is not shown in FIG. 1A or 1B.

FIG. 3B is a circuit diagram of n-type transistors T1 to T5 in the semiconductor device 10 illustrated in FIG. 1A, in accordance with some embodiments.

Referring to FIG. 3B, the transistors T1 to T5 are similar to those described and illustrated with reference to FIG. 3A except that, for example, these transistors T1 to T5 shown in FIG. 3B are n-type transistors.

Unlike some existing semiconductor devices that have one source terminal and one drain terminal in layout, the semiconductor device 10 includes more than two source/drain terminals. In the present embodiment, the semiconductor device 10 includes four source/drain terminals SD1, SD2, SD3 and SD4. In other embodiments, however, the semiconductor device 10 may include more than two parallel legs and thus more than four source/drain terminals. With the multiple source/drain terminals, the layout of the semiconductor device 10 is flexible, which may facilitate complex circuit designs and benefit area cost.

Figure 4:
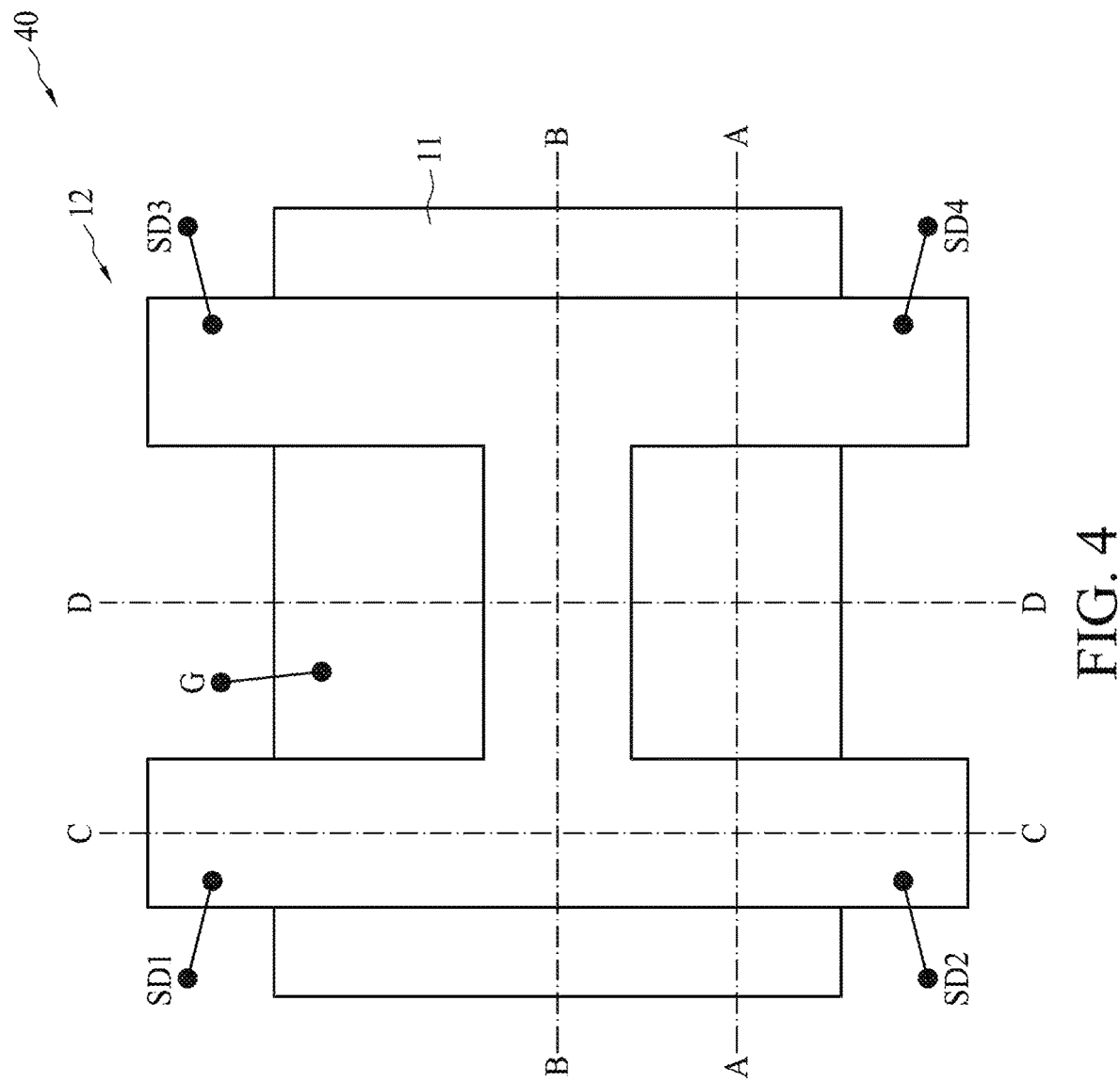
FIG. 4 is a schematic layout diagram of a semiconductor device, in accordance with some embodiments.

FIG. 4 is a schematic layout diagram of a semiconductor device 40, in accordance with some embodiments.

Referring to FIG. 4, the semiconductor device 40 is similar to the semiconductor device 10 described and illustrated with reference to FIG. 1A except that, for example, the gate region 11 is disposed under the source/drain region 12.

FIGS. 5A, 5B, 5C and 5D are cross-sectional diagrams of the semiconductor device 40 illustrated in FIG. 4, taken from lines AA, BB, CC and DD, respectively.

Figure 5A:
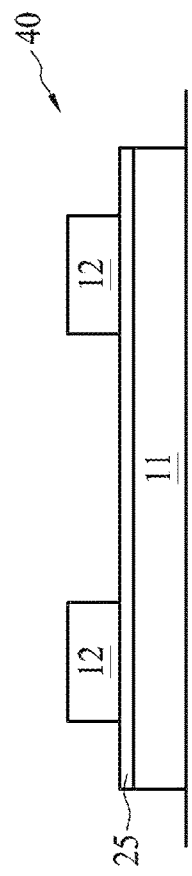
FIGS. 5A to 5D are cross-sectional diagrams of the semiconductor device illustrated in FIG. 4, taken from lines AA to DD, respectively.
Figure 5B:
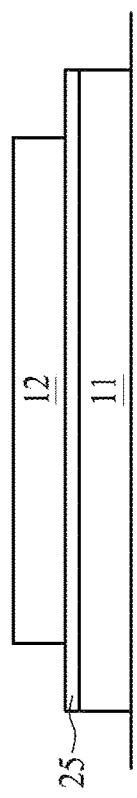
Figure 5C:
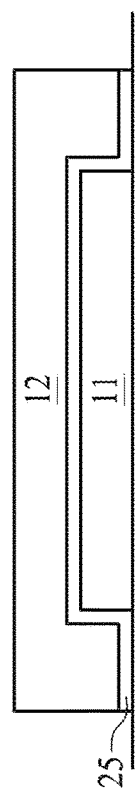
Figure 5D:
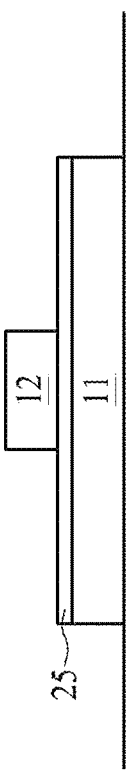

Referring to FIG. 5A, for example, the semiconductor device 40 includes an insulating layer 25, which is not shown in FIG. 4 for brevity. The insulating layer 25 is disposed between the gate region 11 and the source/drain region 12. Since the gate region 11 is disposed under the source/drain region 12, the semiconductor device 40 has a "bottom-gate" structure and the transistors in the semiconductor device 40 are termed "bottom-gate transistors." In a bottom-gate structure, the gate region 11 is disposed between the source/drain region 12 and the substrate of the semiconductor device 40. A circuit structure of the semiconductor device 40 is similar to that described and illustrated with reference to FIG. 3A or 3B. In addition, each of the transistors may include a thin film transistor (TFT).

Figures 6A, 6B:
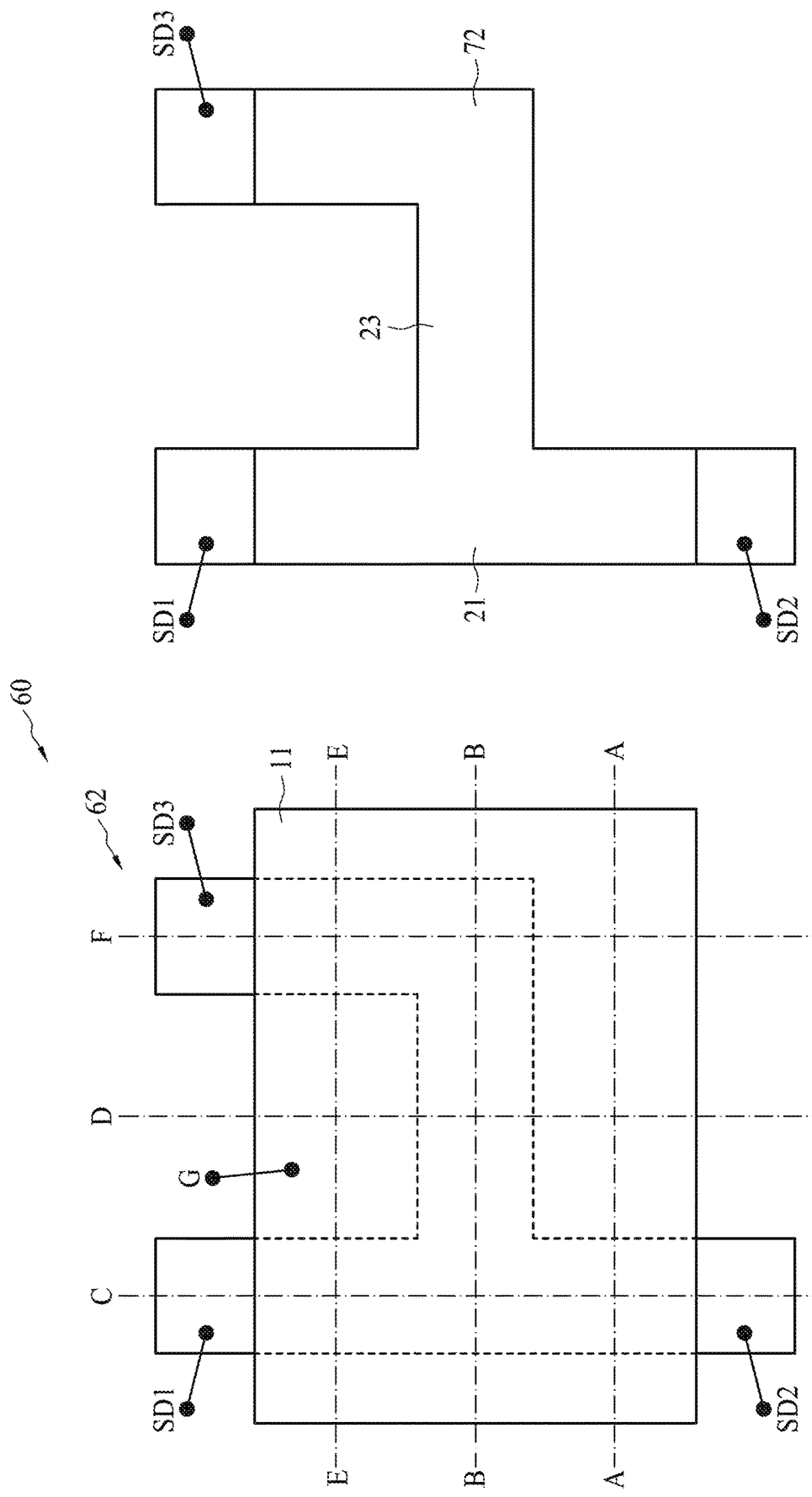
FIG. 6A is a schematic layout diagram of a semiconductor device, in accordance with some embodiments.
FIG. 6B is a schematic diagram of a source and drain region of the semiconductor device illustrated in FIG. 6A, in accordance with some embodiments.

FIG. 6A is a schematic layout diagram of a semiconductor device 60, in accordance with some embodiments.

Referring to FIG. 6A, the semiconductor device 60 is similar to the semiconductor device 10 described and illustrated with reference to FIG. 1A except that, for example, a fourth source/drain SD4 is absent from a source/drain region 62. As a result, in the present embodiment, the semiconductor device 60 includes three source/drain terminals SD1, SD2 and SD3.

FIG. 6B is a schematic diagram of the source/drain region 62 of the semiconductor device 60 illustrated in FIG. 6A, in accordance with some embodiments.

Referring to FIG. 6B, the source/drain region 62 is similar to the source/drain region 12 of the semiconductor device 10 described and illustrated with reference to FIG. 1A. In particular, the source/drain region 62 includes a second leg 72 in addition to the first leg 21 and the third leg 23. Moreover, one end of the third leg 23 is connected to one end of the second leg 72.

FIGS. 7A to 7F are cross-sectional diagrams of the semiconductor device 60 illustrated in FIG. 6A, taken from lines AA to FF, respectively.

Figure 7A:
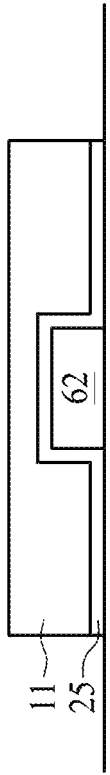
FIGS. 7A to 7F are cross-sectional diagrams of the semiconductor device illustrated in FIG. 6A, taken from lines AA to FF, respectively.
Figure 7B:
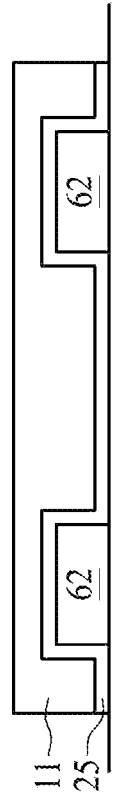
Figure 7C:
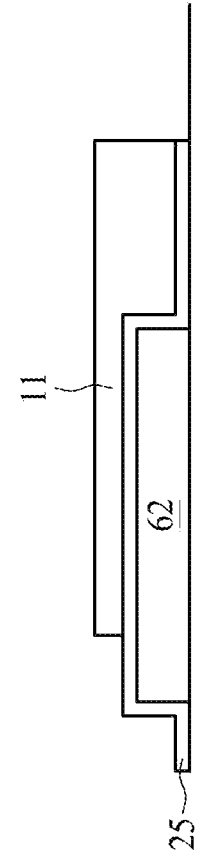
Figure 7D:
Figure 7E:
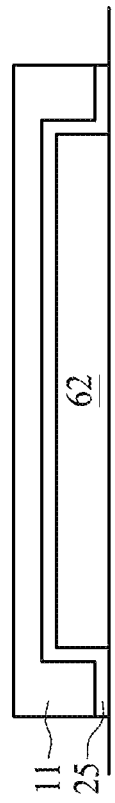
Figure 7F:
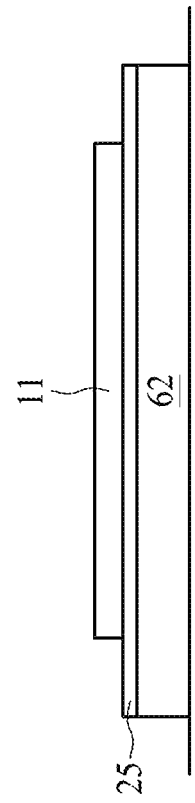

Referring to FIG. 7A, for example, the semiconductor device 60 includes an insulating layer 25, which is not shown in FIG. 6A for brevity. The insulating layer 25 is disposed between the gate region 11 and the source/drain region 62. Since the gate region 11 is disposed over the source/drain region 62, the semiconductor device 60 has a top-gate structure and the transistors in the semiconductor device 60 are termed top-gate transistors.

Figure 8B:
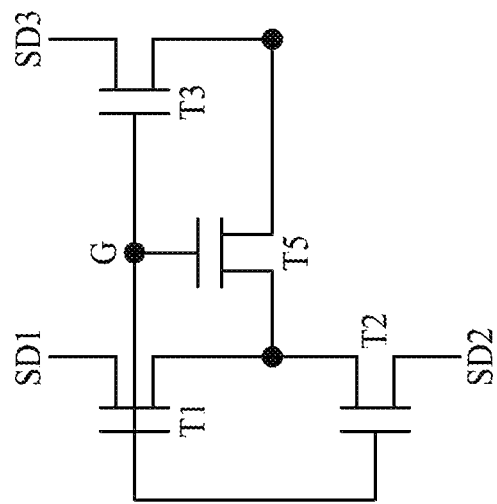
FIG. 8B is a circuit diagram of n-type transistors in the semiconductor device illustrated in FIG. 6A, in accordance with some embodiments.
Figure 8A:
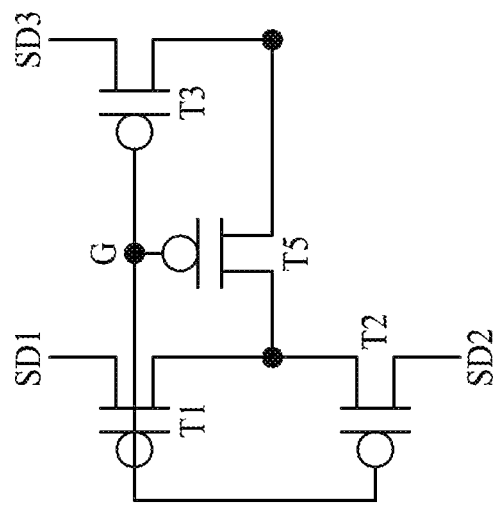
FIG. 8A is a circuit diagram of p-type transistors in the semiconductor device illustrated in FIG. 6A, in accordance with some embodiments.

FIG. 8A is a circuit diagram of p-type transistors T1 to T3 and T5 in the semiconductor device 60 illustrated in FIG. 6A, in accordance with some embodiments.

Referring to FIG. 8A, the circuit is similar to that described and illustrated with reference to FIG. 3A except that, for example, a fourth transistor T4 is absent since the fourth source/drain SD4 is absent from the source/drain region 62.

FIG. 8B is a circuit diagram of n-type transistors T1 to T3 and T5 in the semiconductor device 60 illustrated in FIG. 6A, in accordance with some embodiments.

Referring to FIG. 8B, the transistors T1 to T3 and T5 are similar to those described and illustrated with reference to FIG. 8A except that, for example, these transistors T1 to T3 and T5 shown in FIG. 8B are n-type transistors.

Figure 9:
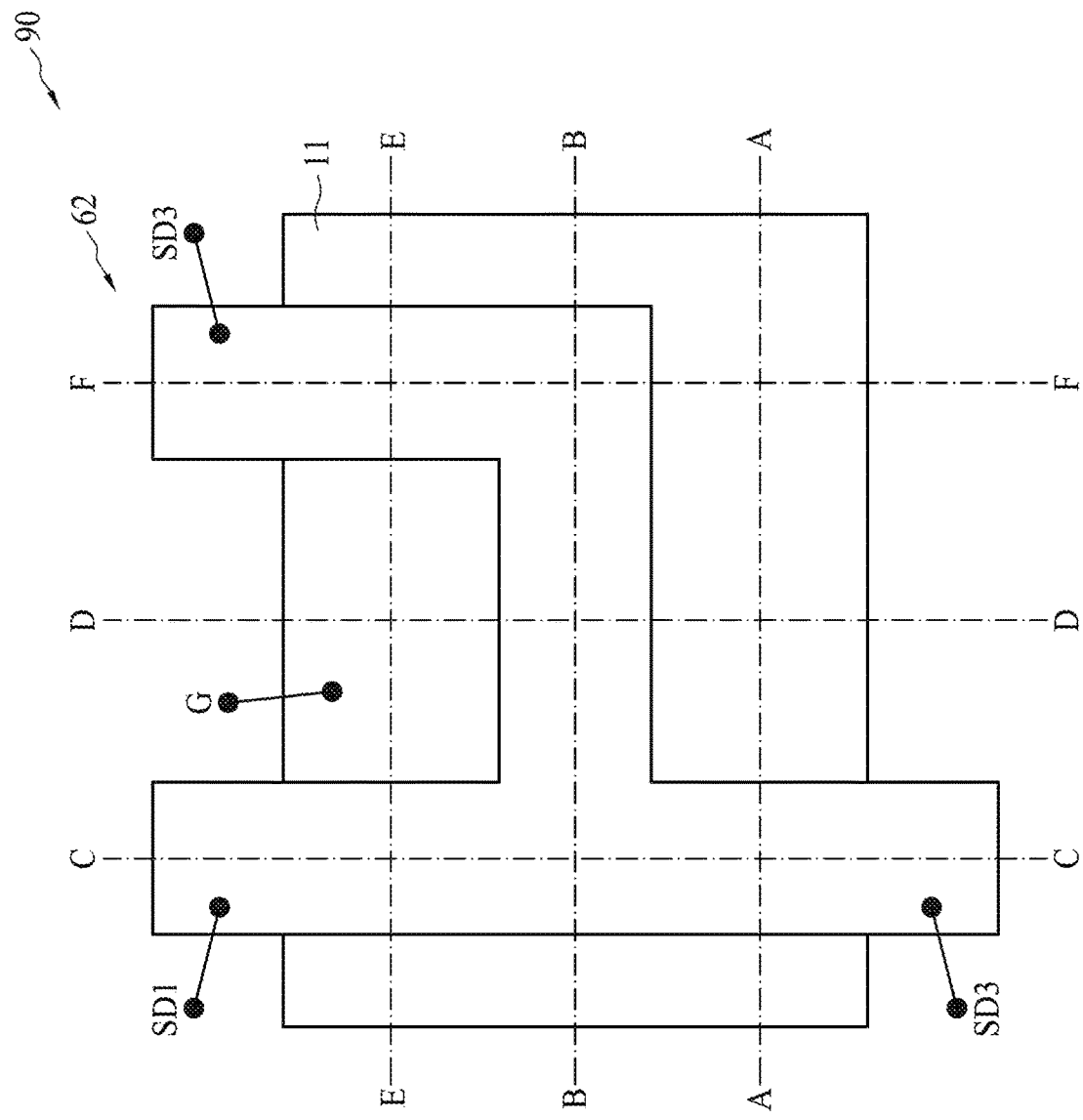
FIG. 9 is a schematic layout diagram of a semiconductor device, in accordance with some embodiments.

FIG. 9 is a schematic layout diagram of a semiconductor device 90, in accordance with some embodiments.

Referring to FIG. 9, the semiconductor device 90 is similar to the semiconductor device 60 described and illustrated with reference to FIG. 6A except that, for example, the gate region 11 is disposed under the source/drain region 62.

FIGS. 10A to 10F are cross-sectional diagrams of the semiconductor device 90 illustrated in FIG. 9, taken from lines AA to FF, respectively.

Referring to FIG. 10A, for example, the semiconductor device 90 includes an insulating layer 25, which is not shown in FUG. 9 for brevity. The insulating layer 25 is disposed between the gate region 11 and the source/drain region 62. Since the gate region 11 is disposed under the source/drain region 62, the semiconductor device 90 has a bottom-gate structure and the transistors in the semiconductor device 90 are termed bottom-gate transistors. A circuit structure of the semiconductor device 90 is similar to that described and illustrated with reference to FIG. 8A or 8B. In addition, each of the transistors may include a thin film transistor (TFT).

Figure 11:
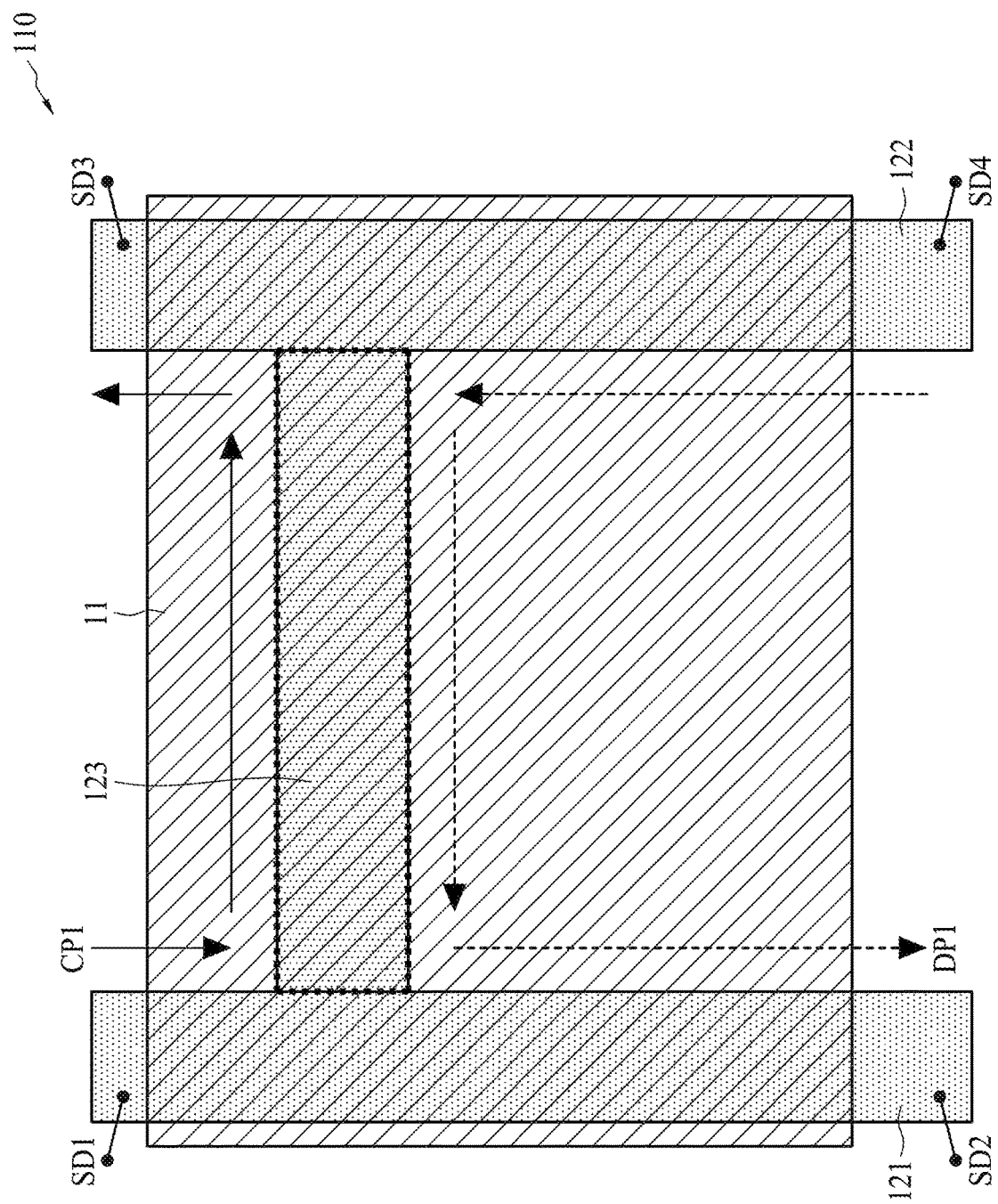
FIG. 11 is a schematic diagram showing a charging path and a driving path in a semiconductor device, in accordance with an embodiment.

FIG. 11 is a schematic diagram showing a charging path CP1 and a driving path DP1 in a semiconductor device 110, in accordance with an embodiment.

Referring to FIG. 11, the semiconductor device 110 is similar to the semiconductor device 10 described and illustrated with reference to FIG. 1A except that, for example, a third leg 123 of the semiconductor device 110 has a different position from the third leg 23 of the semiconductor device 10. Specifically, the third leg 123 is positioned proximate to the terminals SD1 and SD3 and remote to the terminals SD2 and SD4. As a result, a charging path CP1 from terminal SD1 via the third leg 123 to terminal SD3 is shorter than a driving path DP1 from terminal SD4 via the third leg 123 to terminal SD2. The semiconductor device 110 may operate in, for example, an initialization phase, a charging phase and a driving phase. During the charging phase, a charging current flows into the semiconductor device 110 in the charging path CP1. In contrast, during the driving phase, a driving current flows out of the semiconductor device 110 in the driving path DP1. A person having ordinary skill in the art would understand that as far as charging is concerned, a large current having a desired magnitude is required, no matter whether the charging current is uniform. On the contrary, as far as driving is concerned, a uniform current having a desired current density is required, no matter whether the driving current is strong. Moreover, a shorter current path facilitates a charging current, while a longer current path facilitates a driving current.

In the present embodiment, the terminals SD1 and SD3 of a first leg 121 and a second leg 122, respectively, serve for charging operation, while the terminals SD2 and SD4 on the first leg 121 and the second leg 122, respectively, serve for driving operation. As the third leg 123 is disposed near the terminals SD1 and SD3 associated with a charging operation, the charging path CP1 is shorter than the driving path DP1, which is advantageous for the charging and driving operations of the semiconductor device 110.

In some embodiments, the terminals SD1 and SD3 may serve for driving operation, while the terminals SD2 and SD4 serve for charging operation. In that case, the third leg 123 is disposed proximate to the terminals SD2 and SD4 on a charging path, and remote to the terminals SD1 and SD3 on a driving path.

Although a top-gate structure is illustrated, the inventive embodiments that a third leg disposed closer to a charging path than a driving path are applicable to bottom-gate structures.

Figure 12:
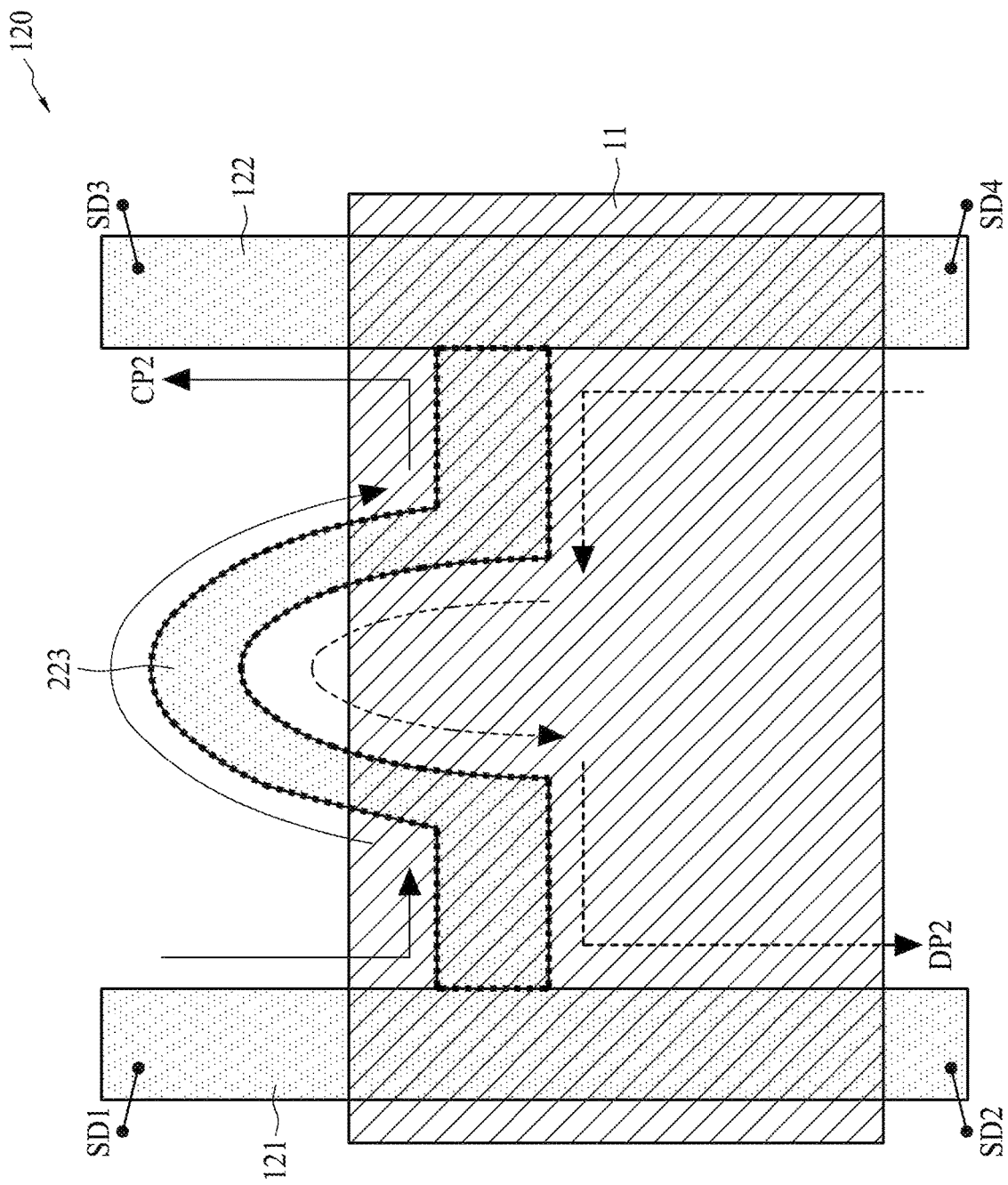
FIG. 12 atic diagram showing a charging path and a driving path in a semiconductor device, in accordance with another embodiment.

FIG. 12 is a schematic diagram showing a charging path CP2 and a driving path DP2 in a semiconductor device 120, in accordance with another embodiment.

Referring to FIG. 12, the semiconductor device 120 is similar to the semiconductor device 110 described and illustrated with reference to FIG. 11 except that, for example, a third leg 223 of the semiconductor device 120 has a different shape from the third leg 123 of the semiconductor device 110. In the present embodiment, the third leg 223 has a shape like a hump. In addition, the "hump" of the third leg 223 is disposed closer to the terminals SD1 and SD3 on a charging path CP2 than the terminals SD2 and SD4 on a driving path DP2. In other embodiments, the third leg 223 has an arbitrary shape, as long as a relatively short charging path while a relatively long driving path can exist. Effectively, as the third leg 123 of the semiconductor device 110 illustrated in FIG. 11, a shorter charging path and a longer driving path are achieved, resulting in a larger charging current and a more uniform driving current, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate region;
a source/drain region; and
an insulating layer between the gate region and the source/drain region;
wherein the source/drain region includes a first leg extending in a first direction, a second leg separate from and extending in parallel with the first leg, and a third leg arranged to connect the first leg to the second leg separate from the first leg; one end of the third leg is in contact with a portion between two ends of the first leg; the gate region and each of the first leg, the second leg and the third leg are disposed one over the other, one of the gate region and the third leg is disposed directly over the other of the gate region and the third leg along a direction in which the one of the gate region and the third leg is orthogonally projected onto the other of the gate region and the third leg, and the gate region is common to the first leg, the second leg and the third leg of the source/drain region.

2. The semiconductor device according to claim 1, wherein the third leg extends in a second direction different from the first direction.

3. The semiconductor device according to claim 2, wherein the second direction is orthogonal to the first direction.

4. The semiconductor device according to claim 1, wherein the source/drain region includes a first source/drain terminal, a second source/drain terminal and a third source/drain terminal, which are not overlapped with the gate region.

5. The semiconductor device according to claim 4, wherein the first source/drain terminal and the gate region define a first transistor, the second source/drain terminal and the gate region define a second transistor, and the third source/drain terminal and the gate region define a third transistor.

6. The semiconductor device according to claim 1, wherein another end of the third leg is connected to one end of the second leg.

7. The semiconductor device according to claim 4, further comprising a fourth source/drain terminal.

8. The semiconductor device according to claim 7, wherein the fourth source/drain terminal and the gate region define a fourth transistor.

9. The semiconductor device according to claim 1, wherein the third leg is disposed proximate to source/drain terminals on the first leg and the second leg that define a charging current path together with the third leg.

10. The semiconductor device according to claim 9, wherein the third leg has a shape of a hump.

11. A semiconductor device, comprising:
a gate region; and
a source/drain region, comprising:
a first source/drain terminal;
a second source/drain terminal; and
a third source/drain terminal,
wherein the first, second and third source/drain terminals are separate from each other and each of the first, second and third source/drain terminals is not overlapped with the gate region; the source/drain region further comprises a first leg, a second leg and a third leg, and the second leg separates from and extends in parallel with the first leg; the third leg is arranged to connect the first leg to the second leg separate from the first leg, and one end of the third leg is in contact with a portion between different ends of the first leg; the first source/drain terminal and the second source/drain terminal are connected to the different ends of the first leg respectively, and the third source/drain terminal is connected to one end of the second leg; the gate region and each of the first leg, the second leg and the third leg are disposed one over the other, one of the gate region and the third leg is disposed directly over the other of the gate region and the third leg along a direction in which the one of the gate region and the third leg is orthogonally projected onto the other of the gate region and the third leg, and the gate region is common to the first leg, the second leg and the third leg of the source/drain region.

12. The semiconductor device according to claim 11, wherein the first source/drain terminal and the gate region define a first transistor, the second source/drain terminal and the gate region define a second transistor, and the third source/drain terminal and the gate region define a third transistor.

13. The semiconductor device according to claim 11, wherein the first leg extends in a first direction from the first source/drain terminal to the second source/drain terminal.

14. The semiconductor device according to claim 11, wherein another end of the third leg is in contact with a portion between different ends of the second leg.

15. The semiconductor device according to claim 11, wherein another end of the third leg is connected to one end of the second leg.

16. The semiconductor device according to claim 11, further comprising a fourth source/drain terminal not overlapped with the gate region.

17. The semiconductor device according to claim 16, wherein the second leg extending from the third source/drain terminal to the fourth source/drain terminal.

18. The semiconductor device according to claim 16, wherein the fourth source/drain terminal and the gate region define a fourth transistor.

19. The semiconductor device according to claim 11, wherein the source/drain region is disposed between the gate region and a substrate of the semiconductor device.

20. The semiconductor device according to claim 11, wherein the gate region is disposed between the source/drain region and a substrate of the semiconductor device.

* * * * *